(12) United States Patent
Singh et al.

(10) Patent No.: US 11,810,879 B2
(45) Date of Patent: Nov. 7, 2023

(54) SEMICONDUCTOR STRUCTURE INCLUDING BUFFER LAYER

(71) Applicant: TAIWAN SEMICONDUCTOR MANUFACTURING COMPANY, LTD., Hsinchu (TW)

(72) Inventors: Gulbagh Singh, Hsinchu (TW); Chih-Ming Lee, Hsinchu (TW); Chi-Yen Lin, Hsinchu (TW); Wen-Chang Kuo, Hsinchu (TW); C. C. Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/698,794

(22) Filed: Mar. 18, 2022

(65) Prior Publication Data
US 2022/0208704 A1  Jun. 30, 2022

Related U.S. Application Data

(63) Continuation of application No. 16/904,176, filed on Jun. 17, 2020, now Pat. No. 11,309,268, which is a
(Continued)

(51) Int. Cl.
*H01L 23/00* (2006.01)
*H01L 29/06* (2006.01)
(Continued)

(52) U.S. Cl.
CPC ............ *H01L 24/06* (2013.01); *G06F 30/392* (2020.01); *G06F 30/398* (2020.01); *H01L 21/78* (2013.01);
(Continued)

(58) Field of Classification Search
CPC ....... H01L 21/78; H01L 21/48; H01L 21/568; H01L 21/76804; H01L 22/34; H01L 22/30; H01L 23/522; H01L 23/5226; H01L 23/528; H01L 23/5329; H01L 23/562; H01L 23/585; H01L 23/3114;
(Continued)

(56) References Cited

U.S. PATENT DOCUMENTS 7,260,442 B2   8/2007   Hwang et al.
7,701,070 B1   4/2010   Li
(Continued)

FOREIGN PATENT DOCUMENTS

CN   102468247   5/2012

OTHER PUBLICATIONS

Office Action dated Jun. 3, 2020 from corresponding application No. CN 201710834344.6.

*Primary Examiner* — Nikolay K Yushin
(74) *Attorney, Agent, or Firm* — Hauptman Ham, LLP

(57) ABSTRACT

A semiconductor structure includes a first contact pad over an interconnect structure. The semiconductor structure further includes a second contact pad over the interconnect structure, wherein the second contact pad is electrically separated from the first contact pad. The semiconductor structure further includes a first buffer layer over the first contact pad, wherein the first buffer layer is partially over the second contact pad, and an edge of the second contact pad farthest from the first contact pad extends beyond the first buffer layer.

20 Claims, 10 Drawing Sheets

Related U.S. Application Data continuation of application No. 16/231,844, filed on Dec. 24, 2018, now Pat. No. 10,727,191, which is a continuation of application No. 15/642,837, filed on Jul. 6, 2017, now Pat. No. 10,163,831.

(60) Provisional application No. 62/490,326, filed on Apr. 26, 2017.

(51) Int. Cl.
| | |
|---|---|
| H01L 23/522 | (2006.01) |
| H01L 23/58 | (2006.01) |
| H01L 23/528 | (2006.01) |
| H01L 21/78 | (2006.01) |
| H01L 23/532 | (2006.01) |
| G06F 30/392 | (2020.01) |
| G06F 30/398 | (2020.01) |
| H01L 23/544 | (2006.01) |
| H01L 23/31 | (2006.01) |
| H01L 21/66 | (2006.01) |
| H01L 23/525 | (2006.01) |

(52) U.S. Cl.
CPC .......... H01L 23/522 (2013.01); H01L 23/528 (2013.01); H01L 23/5226 (2013.01); H01L 23/5329 (2013.01); H01L 23/562 (2013.01); H01L 23/585 (2013.01); H01L 24/03 (2013.01); H01L 29/0649 (2013.01); H01L 22/34 (2013.01); H01L 23/3114 (2013.01); H01L 23/525 (2013.01); H01L 23/53214 (2013.01); H01L 23/53228 (2013.01); H01L 23/53233 (2013.01); H01L 23/53257 (2013.01); H01L 23/53261 (2013.01); H01L 23/544 (2013.01); H01L 2223/5446 (2013.01); H01L 2223/54426 (2013.01); H01L 2224/0239 (2013.01); H01L 2224/02311 (2013.01); H01L 2224/02371 (2013.01); H01L 2224/0345 (2013.01); H01L 2224/03452 (2013.01); H01L 2224/03464 (2013.01); H01L 2224/03614 (2013.01); H01L 2224/03827 (2013.01); H01L 2224/03848 (2013.01); H01L 2224/0401 (2013.01); H01L 2224/04042 (2013.01); H01L 2224/05111 (2013.01); H01L 2224/05124 (2013.01); H01L 2224/05144 (2013.01); H01L 2224/05147 (2013.01); H01L 2224/05155 (2013.01); H01L 2224/061 (2013.01); H01L 2924/01013 (2013.01); H01L 2924/01029 (2013.01); H01L 2924/2011 (2013.01); H01L 2924/20106 (2013.01); H01L 2924/20107 (2013.01); H01L 2924/20108 (2013.01); H01L 2924/20109 (2013.01); H01L 2924/3512 (2013.01); H01L 2924/35121 (2013.01)

(58) Field of Classification Search
CPC ............. H01L 23/525; H01L 23/53214; H01L 23/53228; H01L 23/53233; H01L 23/53257; H01L 23/53261; H01L 23/544; H01L 24/06; H01L 24/03; H01L 24/24; H01L 29/0649; H01L 29/04; H01L 29/66439; H01L 29/0673; H01L 2223/54426; H01L 2223/5446; H01L 2224/02311; H01L 2224/02371; H01L 2224/0239; H01L 2224/0345; H01L 2224/03452; H01L 2224/03464; H01L 2224/03614; H01L 2224/03827; H01L 2224/03848; H01L 2224/0401; H01L 2224/04042; H01L 2224/05111; H01L 2224/05124; H01L 2224/05144; H01L 2224/05147; H01L 2224/05155; H01L 2224/061; H01L 2924/01013; H01L 2924/01029; H01L 2924/20106; H01L 2924/20107; H01L 2924/20108; H01L 2924/20109; H01L 2924/2011; H01L 2924/3512; H01L 2924/35121; G06F 30/392; G06F 30/398; G06F 30/394

See application file for complete search history.

(56) References Cited

U.S. PATENT DOCUMENTS

| | | |
|---|---|---|
| 7,739,650 B2 | 6/2010 | Torres Robles et al. |
| 8,067,838 B2 | 12/2011 | Park |
| 8,624,359 B2 | 1/2014 | Yang et al. |
| 9,256,709 B2 | 2/2016 | Yu et al. |
| 9,257,398 B2 | 2/2016 | Kim |
| 2013/0087914 A1 | 4/2013 | Yang et al. |
| 2014/0040838 A1 | 2/2014 | Liu et al. |
| 2015/0262946 A1 | 9/2015 | Kim |
| 2015/0278429 A1 | 10/2015 | Chang |

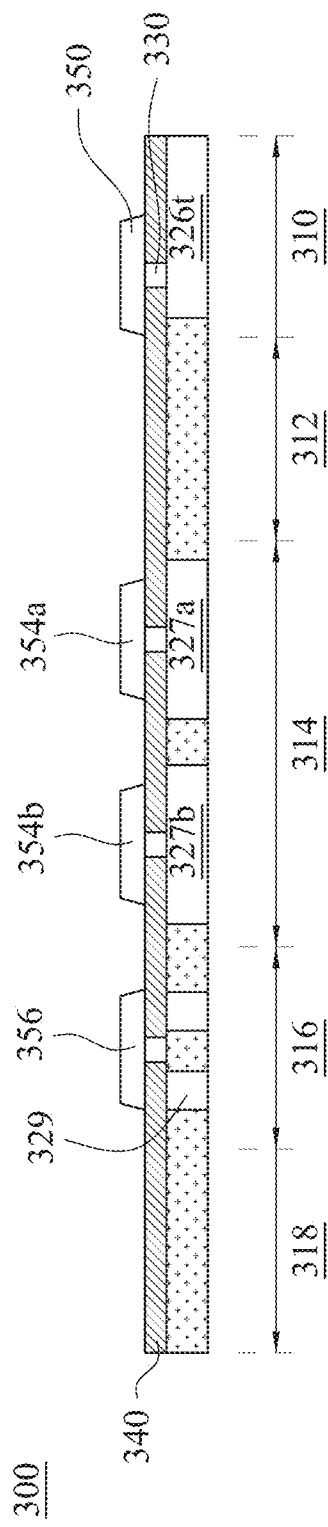
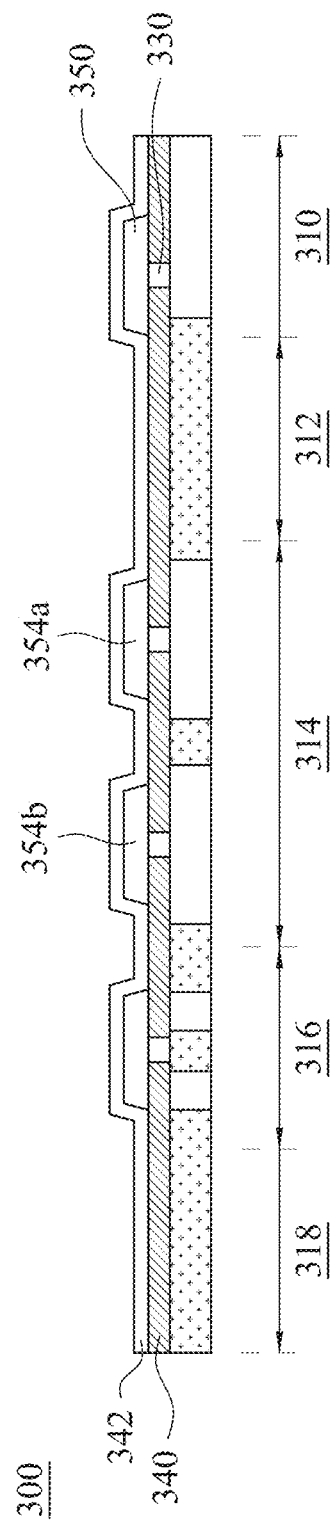
Fig. 3A
Fig. 3B

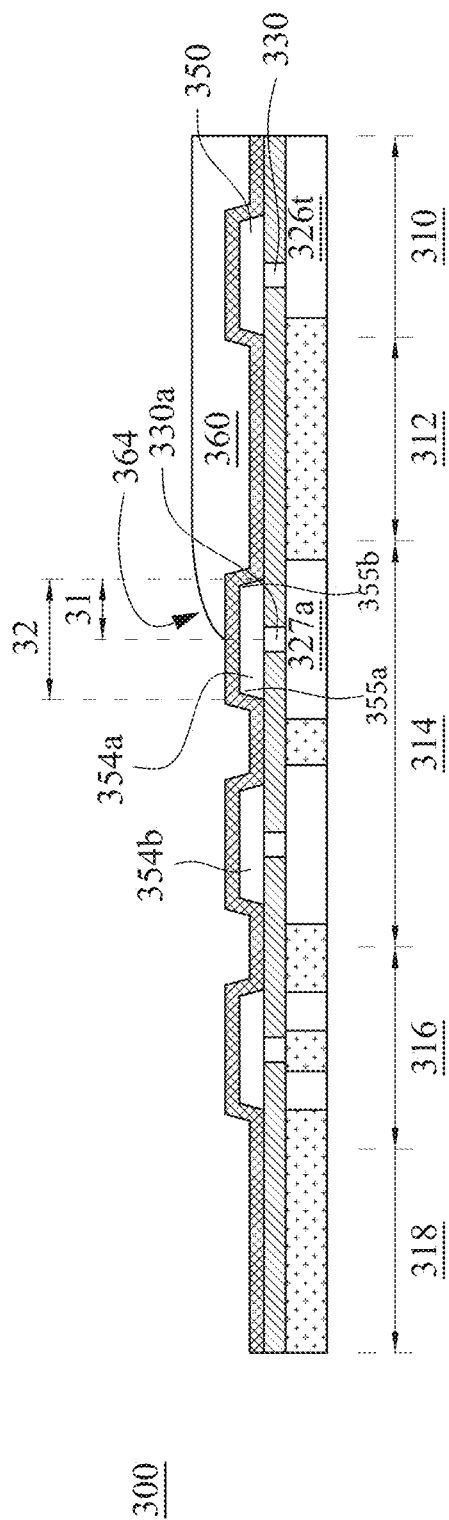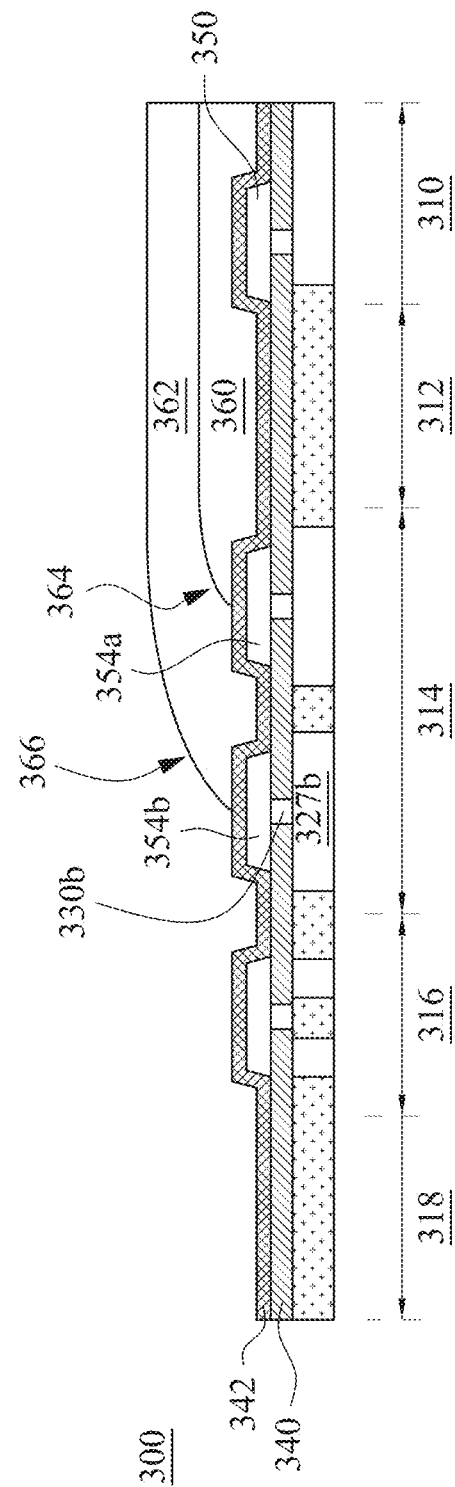
Fig. 3C
Fig. 3D

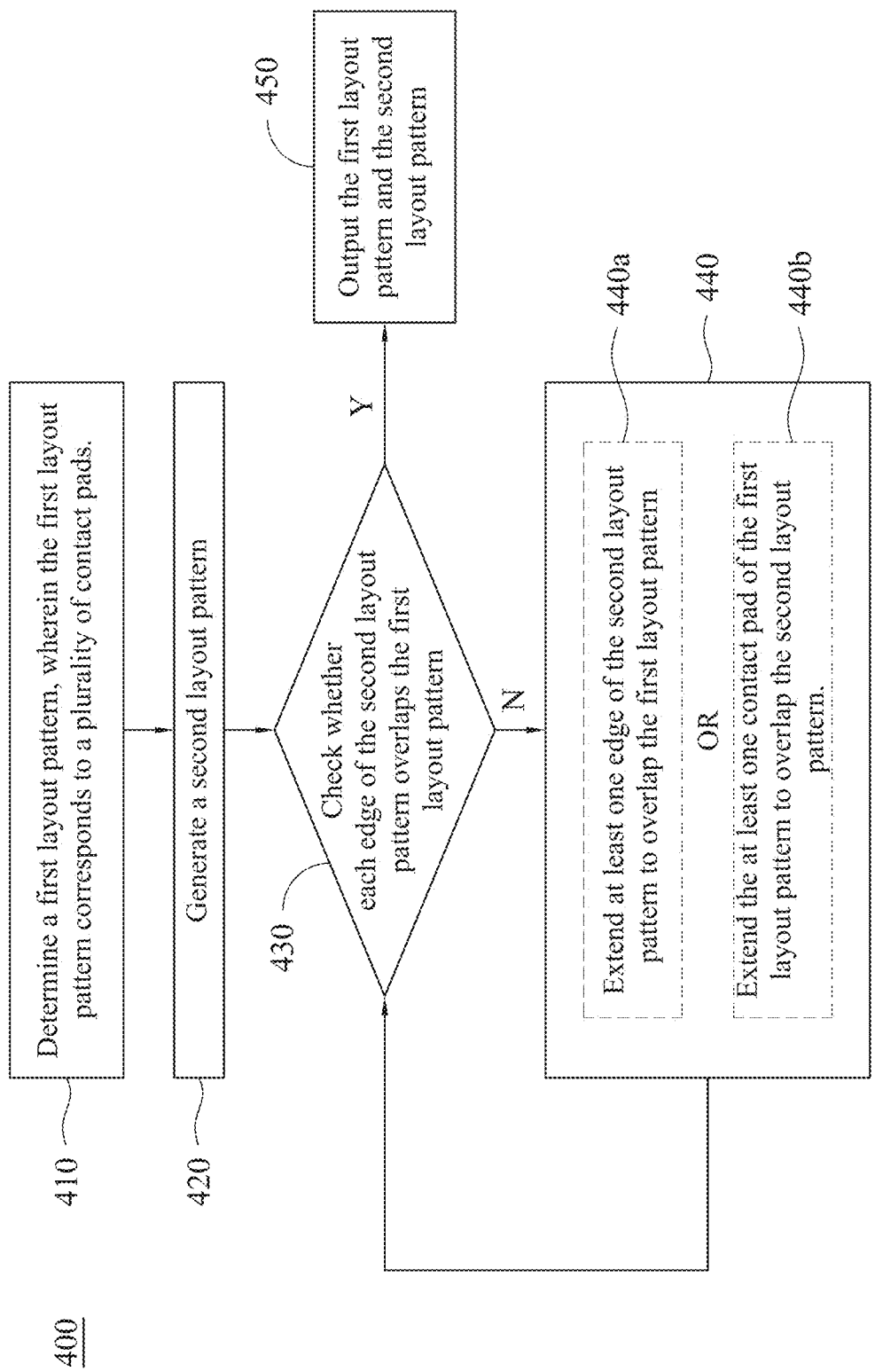

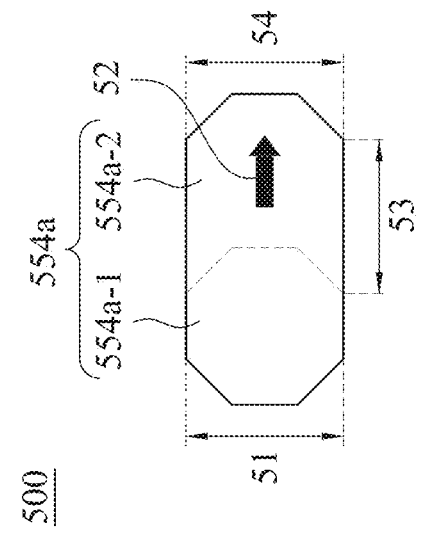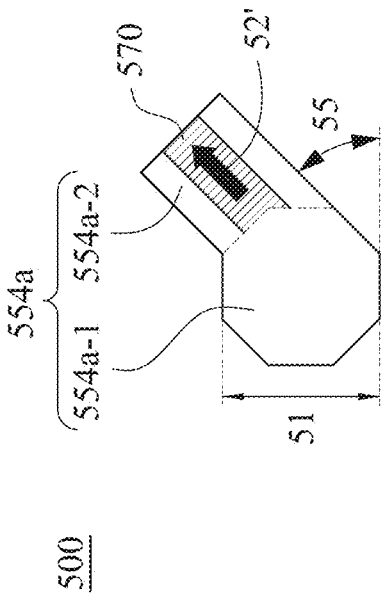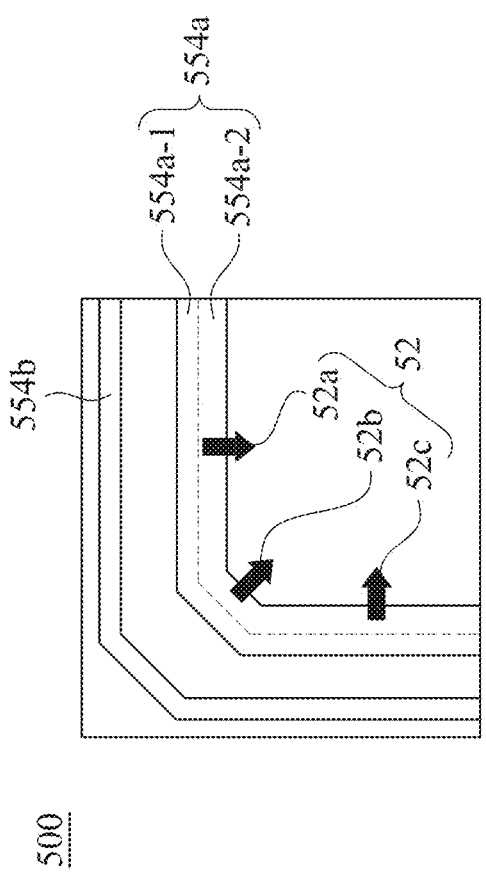

SEMICONDUCTOR STRUCTURE INCLUDING BUFFER LAYER

PRIORITY CLAIM

This application is a continuation of U.S. application Ser. No. 16/904,176, filed Jun. 17, 2020, which is a continuation of U.S. application Ser. No. 16/231,844, filed Dec. 24, 2018, now U.S. Pat. No. 10,727,191, issued Jul. 28, 2020, which is a continuation of U.S. application Ser. No. 15/642,837, filed Jul. 6, 2017, now U.S. Pat. No. 10,163,831, issued Dec. 25, 2018, which claim the priority of U.S. Provisional Application No. 62/490,326, filed Apr. 26, 2017, which are incorporated herein by reference in their entireties.

BACKGROUND

After an integrated circuit (IC) device has completed the fabrication process, the IC device is assembled into a package to be utilized on a printed circuit board (PCB) as part of a larger circuit, in some instances. Contact pads, also referred to as bonding pads, are formed over interconnect structures and are exposed on a surface of a semiconductor die. Electrical connections are formed through contact pads to connect the semiconductor die to a package substrate or another die. In some instances, the contact pad is used for wire bonding or flip-chip bonding. In a wafer level chip scale packaging (WLCSP), a post passivation interconnect (PPI) is used to connect the contact pad and an under-bump metallurgy (UBM) structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3F are cross-sectional views of a semiconductor device at various stages of manufacturing in accordance with one or more embodiments.

FIG. 4 is a flow chart of a method of designing an integrated circuit layout in accordance with some embodiments.

FIGS. 5B-5E are top views of a contact pad in accordance with one or more embodiments.

DETAILED DESCRIPTION

Figure 1:
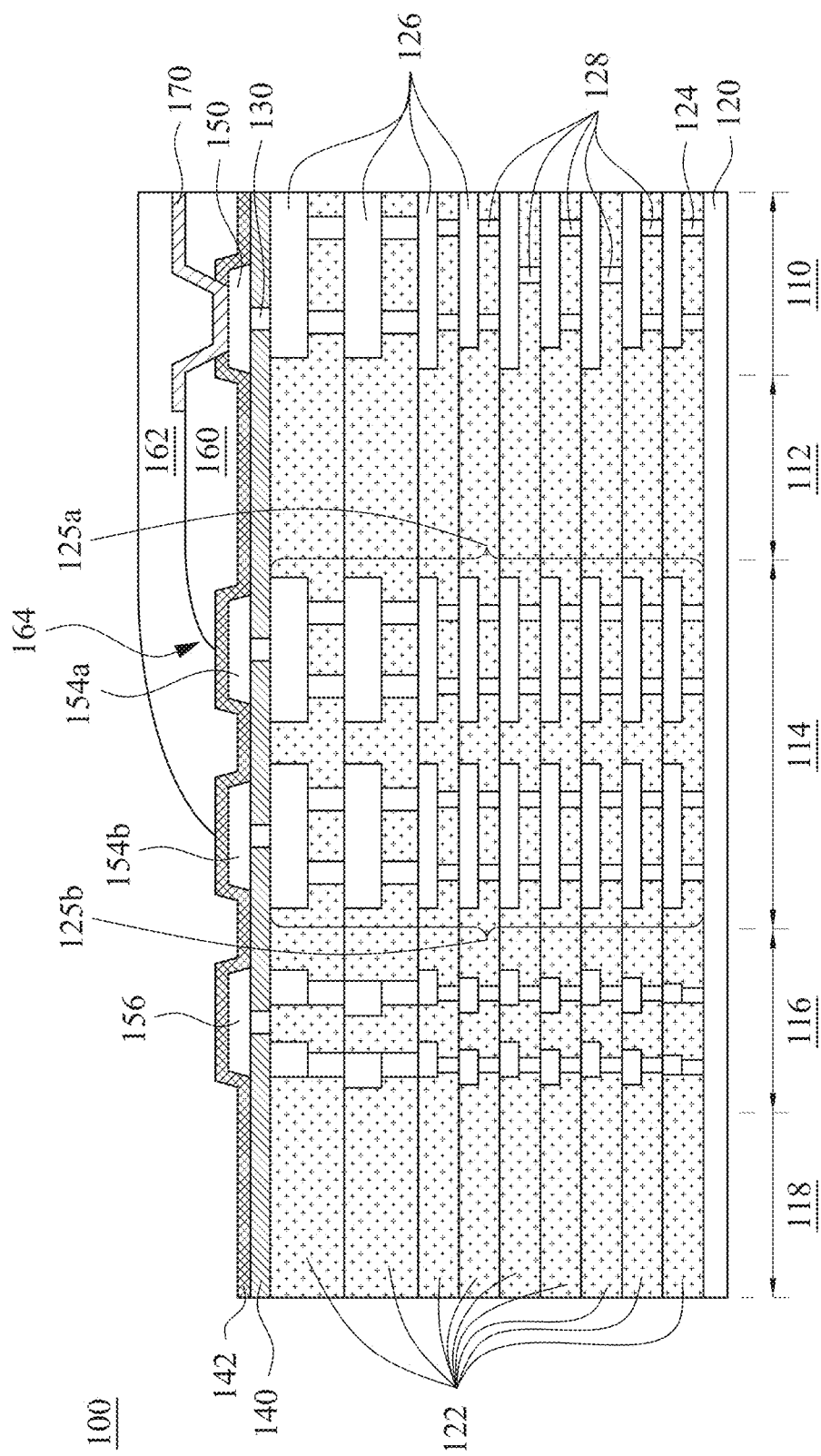
FIG. 1 is a cross-sectional view of a semiconductor device in accordance with one or more embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures.

An integrated circuit (IC) structure includes semiconductor dies including active components such as transistors and diodes and passive components such as capacitors and resistors, which are initially isolated from each other and later electrically coupled to each other and/or to another IC structure through interconnect structures to create functional circuits. Afterward, one or more passivation layers are formed over the interconnect structures to protect the IC structure from being damaged. A plurality of contact pads, also referred to as bond pads in some instances, are formed over the passivation layers and are covered by two stress buffers layer. The stress buffer layers are configured to reduce a stress mismatch that occurs during a packaging process.

A package in which an entire assembly process is completed at a wafer-level is called a wafer-level chip scale package (WLCSP). As the package size decreases, a stress caused from an interface between two buffer layers increases accordingly. In some embodiments, an edge of an inner buffer layer is over a center portion of a contact pad. In some embodiments, the contact pad is in a non-circuit region, such as a seal ring region, a dummy pattern region or an assembly isolation region. In comparison with other approaches, the stress applied to the passivation layer is reduced by about 40% to about 60%, resulting in an improvement in reliability and stability of the IC structure. For example, a risk of defects, such as peeling and/or cracking that occur in the passivation layer is reduced because the tensile stress on the passivation layer is absorbed and compensated for by a compressive force which is generated by the contact pad.

FIG. 1 is a cross-sectional view of a semiconductor device 100 in accordance with one or more embodiments. Semiconductor device 100 includes a circuit region 110, an assembly isolation region 112, a seal ring region 114, a dummy pattern region 116 and a scribe line region 118. Circuit region 110 includes a variety of electrical devices, such as passive components or active components. The electrical devices are formed in a substrate 120 and are electrically connected by interconnect structures, which are stacked and disposed through inter-metal dielectric (IMD) layers 122, to each other or to another circuitry. In some embodiments, the interconnect structures include contact plugs 124, conductive lines 126 and/or via plugs 128. The interconnect structures include at least one of include aluminum, copper, copper alloy, titanium, titanium nitride, tantalum, tantalum nitride, tungsten, metal silicide, combinations thereof or other suitable materials. In some embodiments, the interconnect structures further include via plugs 130 disposed over the IMD layers, and contact pads 150, 154a, 154b (collectively referred to as contact pad 154) and 156. Contact pad 150 is in circuit region 110. Contact pad 154 is in seal ring region 114. Contact pad 156 is in dummy pattern region 116.

Assembly isolation region 112 surrounds circuit region 110 and is surrounded by seal ring region 114 with respect to a top plan view. In some embodiments, assembly isolation region 112 is configured to provide physical and electrical isolation between components in circuit region 110 and components in seal ring region 114. In at least one embodiment, a width of assembly isolation region 112 ranges from about 3 micrometers (μm) to about 10 μm. If the width of assembly isolation region 112 is too great, an occupation area of a chip is increased, resulting in a lower production yield, in some instances. If the width is too small, the physical and electric isolation provided to circuit region 110 is insufficient, in some instances.

Seal ring region 114 includes a first seal ring structure 125a and a second seal ring structure 125b, which are configured to protect circuit region 110 from moisture degradation, ionic contamination and damage during dicing and packaging processes. In particular, contact pad 154a corresponds to first seal ring structure 125a and contact pad 154b corresponds to second seal ring structure 125b. In some embodiments, first and second seal ring structures 125a-b are formed simultaneously with the construction of the interconnect structures in circuit region 110. In some embodiments, interconnect structures in circuit region 110 and seal ring structures in seal ring region 114 are rerouted or extended into assembly isolation region 112 so as to form at least one electrical component in assembly isolation region 112. In some embodiments, seal ring region 114 has more than two or just one seal ring structure. When seal ring region 114 has multiple seal ring structures, an inner seal ring structure (e.g., first seal ring structure 125a) is configured to couple with the passive components to increase noise immunity and isolation bandwidth for devices in circuit region 110.

Dummy pattern region 116 surrounds seal ring region 114 and is surrounded by scribe line region 118 with respect to a top plan view. In some embodiments, dummy pattern region 116 includes dummy bars, virtual bars for line end, virtual bars for corner rounding, dummy pads, and/or other patterns. In some embodiments, structures in dummy pattern region 116 are formed simultaneously with the construction of the interconnect structures in circuit region 110 using a method such as a dual damascene technique. Scribe line region 118 defines each exposure field on a photomask and each semiconductor die on a wafer. In some embodiments, scribe line region 118 includes an exposure field alignment mark for each exposure field, a die alignment mark for each die, and/or a device under test for monitoring manufacturing processes.

Scribe line region 118 separates adjacent semiconductor dies to allow for a width of a blade during a sawing process. In some embodiments, scribe line region 118 is free of the interconnect structures. In some embodiments, one or more test circuits including multiple test pads (commonly referred to as a test key) are in scribe line region 118 to monitor physical characteristics and/or verify electrical features during the manufacturing processes.

Semiconductor device 100 further includes a first passivation layer 140, a second passivation layer 142, contact pads 150-156, a first buffer layer 160 and a second buffer layer 162. First passivation layer 140 is over a topmost IMD layer 122 to protect the underlying interconnect structures and electrical devices from damage and contamination. In some embodiments, first passivation layer 140 further provides protection to help prevent or decrease moisture, mechanical, and radiation damage to the underlying electrical devices. Second passivation layer 142 is over first passivation layer 140 and contact pads 150-156. In some embodiments, second passivation layer 142 is configured to protect contact pads 150-156 from being damaged. In some embodiments, second passivation layer 142 is configured to absorb or release thermal and/or mechanical stress caused during dicing and packaging processes.

First buffer layer 160 is over a periphery of contact pad 150, i.e., a central portion of contact pad 150 contacts a post passivation interconnect (PPI) structure 170, also referred to as a redistribution line (RDL), in some instances. In addition, first buffer layer 160 is partially over contact pad 154a, i.e., an edge 164 of first buffer layer 160 is on a central portion of contact pad 154a. In some embodiments, first buffer 160 extends from circuit region 110 to scribe line region 118. In some embodiments, edge 164 overlaps stacked layers of first seal ring structure 125a in a direction perpendicular to the top surface of first passivation layer 140. In some embodiments, first buffer layer 160 fills openings in second passivation layer 142. First buffer layer 160 includes at least one of polyimide (PI), benzocyclobutene (BCB), polybenzoxazole (PBO), epoxy, silicone, acrylates, nano-filled phenolic resin or other suitable material. Second buffer layer 162 is completely over first buffer layer 160 and covers a portion of contact pad 154a exposed by first buffer layer 160. Additionally, second buffer layer 162 is partially over contact pad 154b. In some embodiments, a combination of first buffer layer 160 and second buffer layer 162 is configured to serve as a buffer for a stress mismatch resulted from differences in the coefficients of thermal expansion (CTE) of a semiconductor die and a substrate. In some embodiments, first buffer layer 160 is configured to reduce a stress extended on PPI structure 170; and second buffer layer 162 is configured to reduce a stress extended on subsequent structures, such as metallic bumps formed over second buffer layer 162. In some embodiments, a combination of first buffer layer 160 and second buffer layer 162 is further configured for structural support and physical isolation of a conductive bump during packaging processes.

During the manufacturing process, first buffer layer 160 is cured under a heat treatment. For example, the heat treatment is performed in an oven filled with inert gas and at a temperature ranging from about 200 degrees Celsius to about 400 degrees Celsius. As such, a tensile/shrinkage stress is caused in first buffer layer 160. As a result, the stress applied to the underlying layers such as second passivation layer 142 and/or first passivation layer 140 is reduced by about 40% to about 60% of that caused in other approaches because the stress distribution is spread across contact pad 154a.

Figure 2:
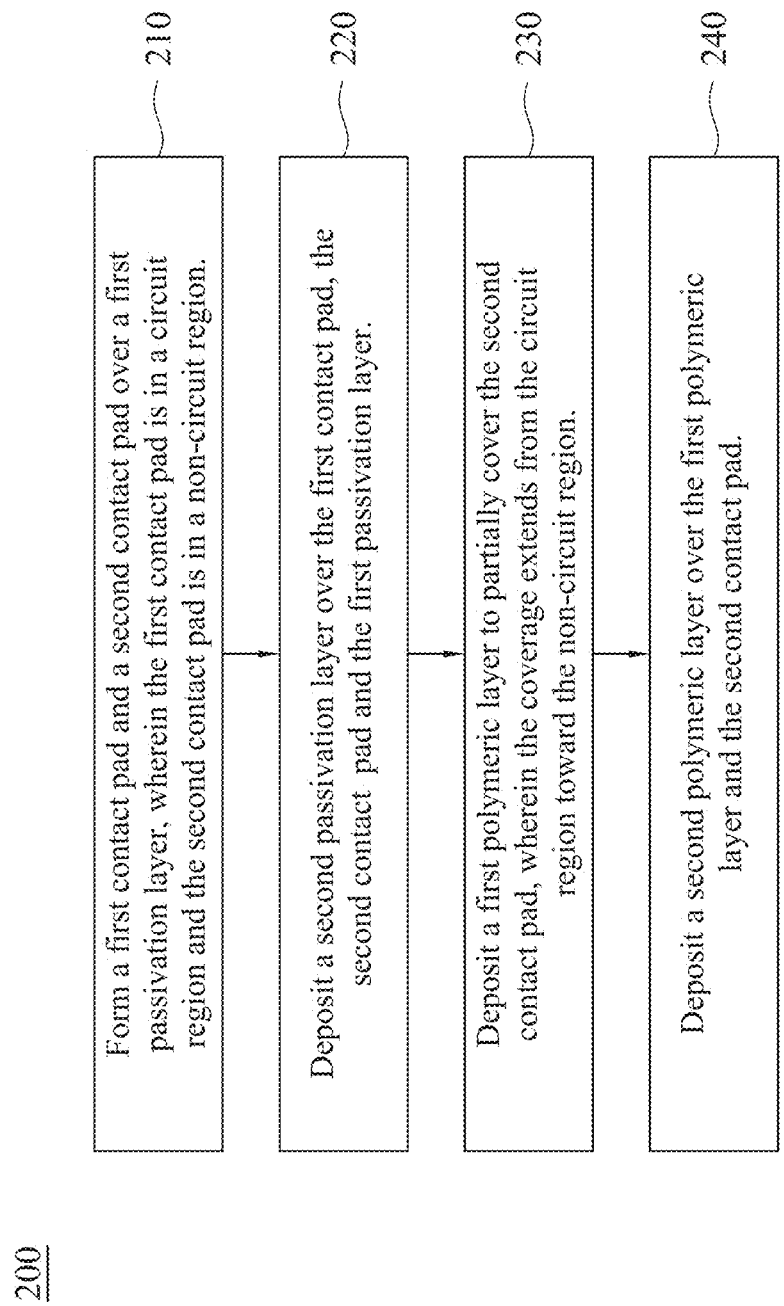
FIG. 2 is a flow chart of a method of fabricating a semiconductor device in accordance with one or more embodiments.

FIG. 2 is a flow chart of a method 200 of fabricating a semiconductor device in accordance with one or more embodiments. One of ordinary skill in the art would understand that additional operations are able to be performed before, during, and/or after method 200 depicted in FIG. 2.

Additional details of the fabricating process are provided below with respect to FIGS. 3A-3F, in accordance with some embodiments.

Method 200 includes operation 210 in which a first contact pad (e.g., contact pad 154a in FIG. 1) and a second contact pad (e.g., contact pad 154b in FIG. 1) are formed over a first passivation layer (e.g., first passivation layer 140 in FIG. 1). The first contact pad is in a circuit region (e.g., circuit region 110 in FIG. 1) and the second contact pad is in a non-circuit region (e.g., seal ring region 114, dummy pattern region 116 or assembly isolation region 112 in FIG. 1). In some embodiments, the first passivation layer is formed over a topmost conductive line of interconnect structures and respective IMD layer. In some embodiments, the first passivation layer has a dielectric constant c greater than 3.9. In some embodiments, the first passivation layer is a composite layer including silicon oxide film and silicon oxynitride film. In some embodiments, the first passivation layer includes a non-porous dielectric material such as undoped silicate glass (USG), fluorinated silicate glass (FSG), silicon nitride, a combination thereof or other suitable materials. The first passivation layer is formed using a deposition process, such as chemical vapor deposition (CVD), plasma enhanced chemical vapor deposition (PECVD), high density plasma chemical vapor deposition (HDPCVD), spin coating or another suitable process. In some embodiments, a thickness of the first passivation layer ranges from about 500 nanometers (nm) to about 1200 nm. A thicker first passivation layer increases manufacturing cost without significant benefit, in some instances. A thinner first passivation layer provides an insufficient buffer to reduce the stress mismatch, in some instances.

The first contact pad and the second contact pad are formed over the first passivation layer and are electrically connected to corresponding underlying interconnect structures. The first and the second contact pads are in electrical contact with corresponding via plugs formed in the first passivation layer. In various embodiments, an upper portion of the first and second contact pad forms a recess protruding toward and aligning with the underlying via plug. Alternatively, the first and the second contact pads are in direct contact with the topmost conductive line of the corresponding interconnect structures. In some embodiments, the first and the second contact pads include aluminum, copper, aluminum-copper, a combination thereof or another suitable conductive material. In some embodiments, the formation of the first and the second contact pad includes a deposition process, a lithography process and an etch process. The deposition process includes sputtering, physical vapor deposition (PVD), CVD, atomic layer deposition (ALD), electroless plating or another suitable process. In some embodiments where the first passivation layer includes openings exposing the topmost conductive line, the deposition process fills the openings to form an electrical connection. The etch process includes a wet etching, a dry etching or a combination thereof. In some embodiments, a thickness of the first or the second contact pad ranges from about 50 nm to about 10 μm. A thicker contact pad increases a risk of a filling of the second passivation layer, in some instances. A thinner contact pad increases a risk of being damaged during a subsequent PPI process, in some instances.

Method 200 continues with operation 220 in which a second passivation layer (e.g., second passivation layer 142 in FIG. 1) is deposited over the first contact pad, the second contact pad and the first passivation layer. The second passivation layer is formed over the first passivation layer and the first and second contact pads. In some embodiments, the second passivation layer is formed using a same process as the first passivation layer, such as PECVD. In some embodiments, the second passivation layer is formed using a different process from the first passivation layer, for example, the second passivation layer is deposited using HDPCVD and the first passivation layer is deposited using PECVD. In some embodiments, the second passivation layer includes a same material as the first passivation layer. In some embodiments, the second passivation layer includes a different material from the first passivation layer. In some embodiments, in order to form an electrical connection with subsequent PPI structure, a lithography process and an etch process are applied to selectively pattern the second passivation layer to expose at least one of the first contact pad or the second contact pad. The PPI structure is configured to provide a conductive path between the circuitry and the input/output terminal of the semiconductor device, for example, the conductive bump. In various embodiments, the PPI structure includes aluminum, copper, copper alloy, or other conductive materials and is deposited using sputtering, PVD, CVD, electroless plating or another suitable process.

Method 200 continues with operation 230 in which a first polymeric layer (e.g., first buffer layer 160 in FIG. 1) is deposited to partially cover the second contact pad, wherein the coverage extends from the circuit region toward the non-circuit region. The first polymeric layer is formed over the second passivation layer using a deposition process such as spin-on coating or another suitable process. An edge of the first polymeric layer lands on a central portion of the second contact pad. In some embodiments, the second contact pad is in a seal ring region. In some embodiments, the second contact pad is in a dummy pattern region. In some embodiments, the second contact pad is in an assembly isolation region. When the semiconductor die has a rectangular shape, in some embodiments, each edge of the first polymeric layer is in a same or different regions. For example, one edge of the first polymeric layer lands on one second contact pad in the seal ring region and another edge of the first polymeric layer lands on another second contact pad in the assembly isolation region. As another example where the seal ring region includes multiple seal ring structures, one edge of the first polymeric layer lands on one second contact pad corresponding to a seal ring structure, and one edge of the first polymeric layer lands on another second contact pad corresponding to another seal ring structure. As another example, each edge of the first polymeric layer is in a seal ring region or an assembly isolation region. The first polymeric layer is formed using a deposition process, such as spin coating, dry film lamination process or another appropriate process. In some embodiments, the first polymeric layer is dispensed in a liquid form and is cured using a curing process, such as a heat treatment. In some embodiments, the heat treatment is performed at a temperature ranging from about 200 degrees Celsius to about 400 degrees Celsius. The duration of the curing process is in a range from about 1 minute to about 90 minutes, in accordance with some instances. In some embodiments, the duration of the curing process is longer than 90 minutes. In some embodiments, the first polymeric layer is patterned to expose at least a portion of the PPI structure using a lithography process and an etch process.

Method 200 continues with operation 240 in which a second polymeric layer (e.g., second buffer layer 162 in FIG. 1) is deposited over the first polymeric layer and the second contact pad. The second polymeric layer includes at least one of PI, BCB, PBO, epoxy, silicone, acrylates, phenolic resin or other suitable material. In some embodiments, the deposition of the second polymeric layer includes a spin-on coating, dry film lamination process or another appropriate process. In various embodiments, a portion of the second polymeric layer that covers the contact pad protrudes toward the recess formed at the upper portion of the contact pad. A portion of the second polymeric layer is removed by a lithography process and an etch process. In some embodiments, the removal process includes a laser process or a usage of a molding clamp. In some embodiments, the second polymeric layer is formed using a same process as the first polymeric layer. In some embodiments, the second polymeric layer is formed using a different process from the first polymeric layer. In some embodiments, additional operations are included in method 200, such as forming an under bump metal (UBM) structure over the second polymeric layer after operation 240. In some embodiments, the second polymeric layer is dispensed in a liquid form and is cured using a curing process, such as a heat treatment. In some embodiments, the heat treatment is performed at a temperature ranging from about 200 degrees Celsius to about 400 degrees Celsius. The duration of the curing process is in a range from about 1 minute to about 90 minutes, in accordance with some instances. In some embodiments, the duration of the curing process is longer than 90 minutes. In some embodiments, the curing process of the second polymeric layer and the curing process of the first polymeric layer are performed in a single step. In some embodiments, each curing process is independently performed.

FIGS. 3A-3F are cross-sectional views of a semiconductor device 300 at various stages of manufacturing in accordance with one or more embodiments.

Semiconductor device 300 includes elements similar to semiconductor device 100 and a last two digits of like elements are the same. FIG. 3A is a cross-sectional view of semiconductor device 300 following operation 210. Semiconductor device 300 includes, from a center to a boundary of a semiconductor die, a circuit region 310, an assembly isolation region 312, a seal ring region 314, a dummy pattern region 316 and a scribe line region 318. Circuit region 310 includes a first passivation layer 340 formed over a topmost conductive line 326t for physical isolation and structural support. In some embodiments, first passivation layer 340 includes an inorganic insulating material such as silicon oxide, silicon nitride, silicon oxynitride or silicon carbonitride, or an organic insulating material such as PI, BCB, PBO or epoxy. A plurality of openings are formed in first passivation layer 340 using a lithography process and an etch process so as to expose a portion of a topmost conductive line 326t. A contact pad 350 is electrically connected to topmost conductive line 326t through a via plug 330. In some embodiments, contact pad 350 includes aluminum, copper, aluminum-copper, gold, tin, nickel or another electrically conductive material. In seal ring region 314, contact pads 354a-b are formed in a similar method to contact pad 350. Contact pad 354a is electrically connected to a topmost conductive line 327a of a first seal ring structure, and contact pad 354b is electrically connected to a topmost conductive line 327b of a second seal ring structure. In some embodiments, contact pad 354a is surrounded by a boundary of the first seal ring structure with respect to a top plan view. In some embodiments, contact pad 354a protrudes outwardly from the boundary of the first seal ring structure with respect to a top plan view.

FIG. 3B is a cross-sectional view of semiconductor device 300 following operation 220. A second passivation layer 342 is over first passivation layer 340, and contact pads 350, 354a and 354b. In some embodiments, second passivation layer 342 includes an inorganic insulating material such as silicon oxide, silicon nitride, silicon oxynitride or silicon carbonitride, or an organic insulating material such as PI, BCB, PBO or epoxy. In some embodiments, second passivation layer 342 includes a same material as first passivation layer 340. In some embodiments, second passivation layer 342 includes a different material from first passivation layer 340.

FIG. 3C is a cross-sectional view of semiconductor device 300 following operation 230. A first buffer layer 360 is over second passivation layer 342 and contact pads 350, 354a. In some embodiments, an opening is formed in first buffer layer 360 in order to expose a central portion of contact pad 350 for PPI structures. An edge 364 of first buffer layer 360 is over contact pad 354a, i.e., a coverage of first buffer layer 360 extends from circuit region 310 to seal ring region 314. In some embodiments, a coverage 31 of first buffer layer 360 over contact pad 354a is in a range from about 25% to about 75% of a maximum width 32 of contact pad 354a. A greater or a smaller percentage alters a stress applied to second passivation layer 342 by first buffer layer 360, in some instances. In some embodiments, coverage 31 is around 50% of maximum width 32. In some embodiments, edge 364 of first buffer layer 360 aligns with a central portion of a via plug 330a that is connected to contact pad 354a. In some embodiments, edge 364 of first buffer layer 360 is aligned with a central portion of topmost conductive line 327a.

FIG. 3D is a cross-sectional view of semiconductor device 300 following operation 240. A second buffer layer 362 is over first buffer layer 360. Specifically, second buffer layer 362 covers edge 364. An edge 366 of second buffer layer 362 is over contact pad 354b. In some embodiments, edge 366 of second buffer layer 362 aligns with a central portion of a via plug 330b that is connected to contact pad 354b. In some embodiments, edge 364 of second buffer layer 362 is aligned with a central portion of topmost conductive line 327b.

Figure 3E:
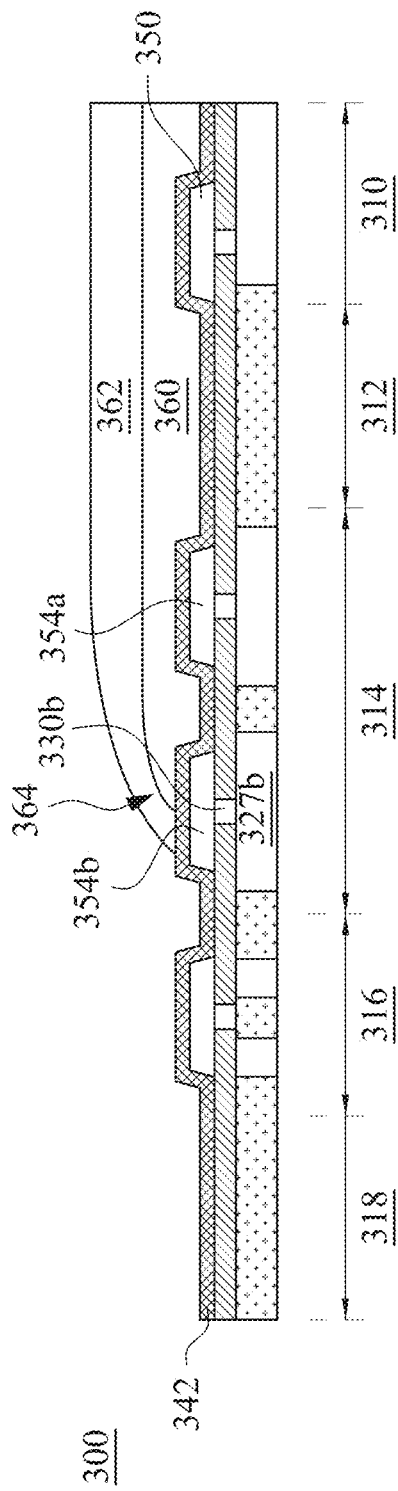

FIG. 3E is another cross-sectional view of semiconductor device 300 following operation 240. In comparison with FIG. 3D, edge 364 of first buffer layer 360 is in seal ring region 314 and is on contact pad 354b. In some embodiments where seal ring region 314 includes a third seal ring structure, edge 364 is over a contact pad 354b over the third seal ring structure. In some embodiments, a coverage of contact pad 354b by first buffer layer 360 is in a range from about 25% to about 75% of a maximum width of contact pad 354b. In some embodiments where semiconductor device 300 includes a third seal ring structure formed in seal ring region 314, edge 364 covers a contact pad of the third seal ring structure by an amount similar to that described with respect to contact pad 354b.

Figure 3F:
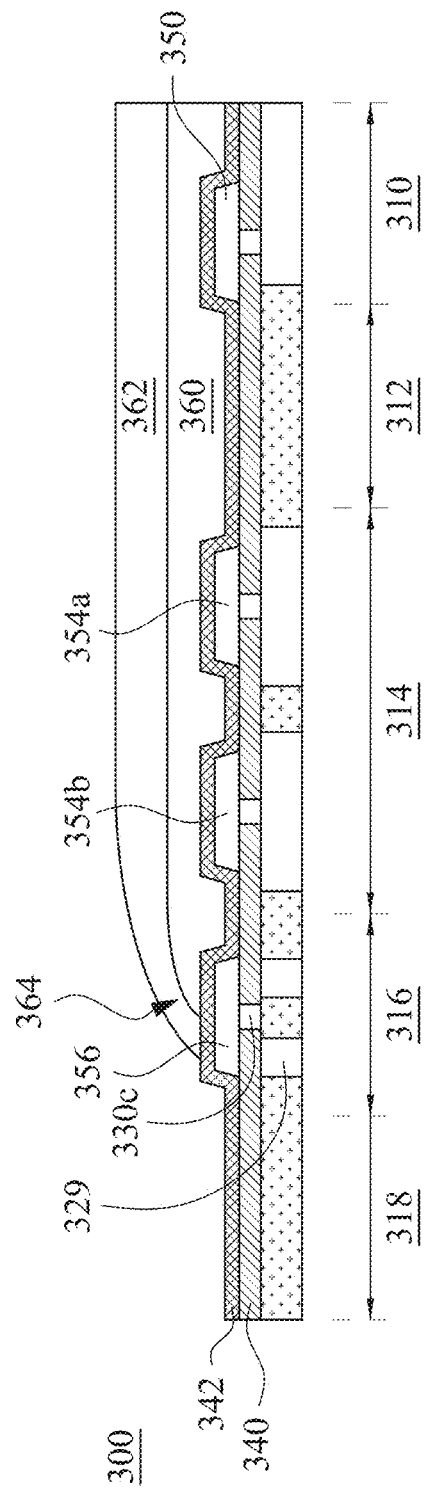

FIG. 3F is another cross-sectional view of semiconductor device 300 following operation 240. In comparison with FIG. 3D, edge 364 of first buffer layer 360 is in dummy pattern region 316 and is over a contact pad 356. In some embodiments, a coverage of contact pad 356 by first buffer layer 360 is in a range from about 25% to about 75% of a maximum width of contact pad 356.

FIG. 4 is a flow chart of a method 400 of designing an integrated circuit layout in accordance with some embodiments. One of ordinary skill in the art would understand that additional operations are able to be performed before, during, and/or after method 400 depicted in FIG. 4. Additional details of the fabricating process are provided below with respect to FIGS. 5A-5E, in accordance with some embodiments.

Method 400 includes operation 410 in which a first layout pattern is determined, wherein the first layout pattern corresponds to a plurality of contact pads, e.g., contact pads 154a, 154b and 156 in FIG. 1. In some embodiments, the first layout pattern corresponds to the contact pads arranged in a same region, such as a seal ring region or a dummy pattern region. In some embodiments, the first layout pattern corresponds to the contact pads in a non-circuit region, such as a combination of the seal ring region and a dummy pattern region. The layout pattern includes polygons or openings to be formed over a semiconductor die. The first layout pattern is generated by an electronic design automation (EDA) tool, such as Synphony from Synopsis®, Virtuoso from Cadence Systems®, or IC Station from Mentor Graphics®. The layout data is provided using a computer readable medium using a standard layout format, such as GDSII. In some embodiments, the layout data is provided through a software interface when the method is executed by an EDA system. Method 400 continues with operation 420 in which a second layout pattern is generated. The second layout pattern corresponds to a buffer layer, e.g., first buffer layer 160 in FIG. 1.

In operation 430, whether each edge of the second layout pattern overlaps the first layout pattern is checked. In some embodiments, a Design Rule Manual (DRM) is loaded and a Design Review Check (DRC) is executed. A DRM is a file that includes one or multiple design rules including constraints followed by IC designers during the design of circuitry. In some embodiments, one or more design rules are a series of parameters used by photomask manufacturers that enable the designer to verify the correctness of a mask set. A DRC is used to describe pattern features and generate flags for violation sites including patterns and paths associated with selected feature received from a selected DRM. If each edge of the second layout pattern fails to overlap the first layout patter, then one or more error flags are shown in the DRC output file and a user or a processor provides options for adjustments to the first or the second layout pattern.

As indicated by 'N' arrow from operation 430, if the check of operation 430 fails, i.e., at least one edge of the second layout pattern is non-overlapping with (separated from) the first layout pattern, method 400 continues with operation 440 in which at least one of the second layout pattern or the first layout pattern is adjusted so that each edge of the second layout pattern overlaps the first layout pattern. Operation 440 includes an optional operation 440a in which at least one edge of the second layout pattern is extended to overlap the first layout pattern; and an optional operation 440b in which at least one contact pad of the first layout pattern is extended to overlap the second layout pattern. Various embodiments of optional operation 440a are discussed below in more detail in association with FIGS. 5A-5E. In some embodiments when optional operation 440b is performed, the extended contact pad protrudes into an assembly isolation region between a circuit region and a non-circuit region. In some embodiments, only one of optional operation 440a or optional operation 440b is performed. In some embodiments, both optional operation 440a and optional operation 440b are performed simultaneously or in sequential steps.

In some embodiments, one or more layout patterns corresponding to underlying interconnect structures are determined. For example, in order to further compensate a more stress spread over a contact pad, a density distribution of the underlying interconnect structures is calculated prior to operation 440. In such a way, during operation 440a, the extended edge of the second layout pattern does not only overlaps a contact pad of the first layout pattern but also aligns with a maximum density distribution of the one or more layout patterns. For example, when a third layout pattern corresponding to via plugs directly under and in touch with contact pads is determined, unless a design rule violation incapable of being waived, the edge of the second layout pattern should lands on a contact pad and align with an underlying via plug. As another example, a fourth layout pattern corresponding to a topmost conductive line of the interconnect structure is further calculated as well as the third layout pattern in order to extend the at least one edge of the second pattern to overlap a location having a maximum density distribution. In some embodiments, the determination of the additional layout pattern and the calculation of the density distribution are performed prior to operation 430. In some embodiments, the determination of the additional layout pattern and the calculation of the density distribution are performed after operation 430.

Alternatively, in operation 430, if each edge of the second layout patterns overlaps the first layout pattern, as indicated by 'Y' arrow form operation 430, method 400 continues with operation 450 in which the first layout pattern and the second layout pattern are outputted for implementation in a semiconductor fabrication process.

Figure 5A:
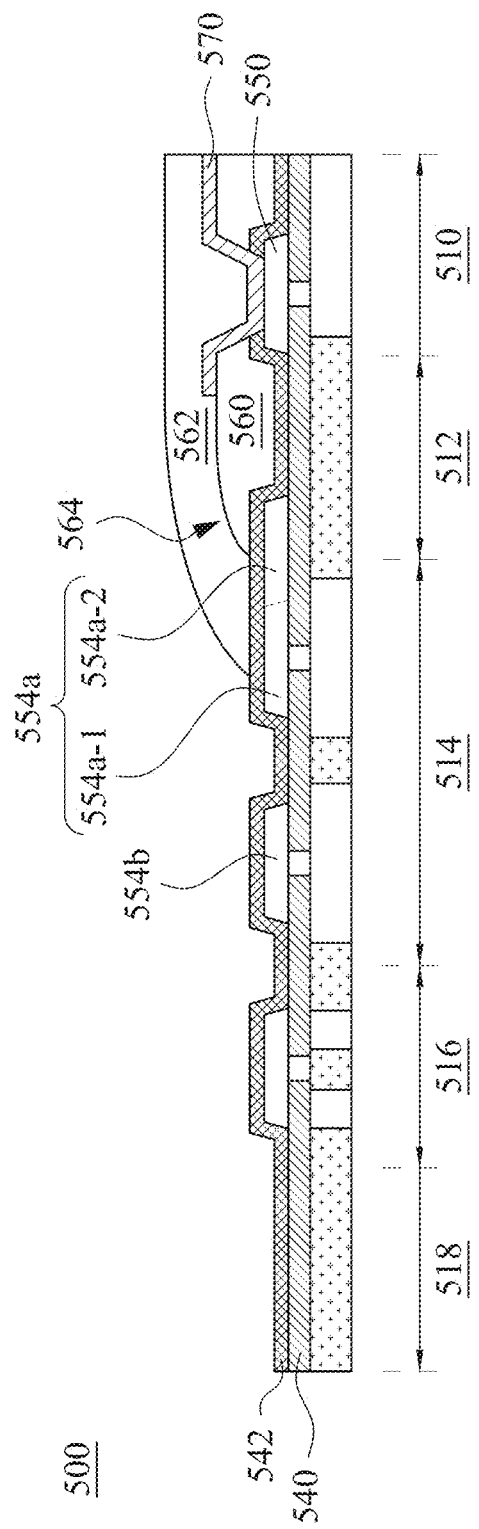
FIG. 5A is a cross-sectional view of a semiconductor device in accordance with one or more embodiments.

FIG. 5A is a cross-sectional view of semiconductor device 500 following operation 440 in accordance with one or more embodiments. Semiconductor device 500 includes elements similar to semiconductor device 100 and a last two digits of like elements are the same. In some embodiments, a contact pad 554a is extended horizontally based on optional operation 440b and thus includes an original portion 544a-1 in a seal ring region 514 and an extended portion 544a-2 in an assembly isolation region 512. In some embodiments, an edge 564 of first buffer layer 560 is simultaneously extended under optional operation 440a. In some embodiments, the extended contact pad is a contact pad arranged in a different seal ring structure, e.g., a contact pad 554b, or a contact pad arranged in a different non-circuit region, such as a dummy pattern region 516.

FIGS. 5B-5E are top views of contact pad 554a in accordance with one or more embodiments. In FIG. 5B, when contact pad 554a is in seal ring region 514, each of contact pad 554 a-b is a continuous line or a discontinuous line surrounding assembly isolation region 512. In some embodiments, initial portion 544a-1 is extended toward assembly isolation region 512. In some embodiments, a portion or an entirety of contact pad 554a is extended along at least one of directions 52a-c during optional operation 440b. In some embodiments, contact pad 554b is extended toward contact pad 554a. In FIG. 5C, when contact pad 554a is in assembly isolation region 512 or dummy pattern region 516, initial portion 544a-1 has an octagonal shape and is extended along a direction 52. In at least one embodiment, direction 52 is orthogonal to an edge of a semiconductor die. In some embodiments, initial portion 544a-1 has a circular shape, a hexagonal shape, a rectangular shape or another appropriate polygonal shape. Extended portion 544a-2 has a length 53 and a width 54. In some embodiments, length 53 ranges from about 1 µm to about 25 µm. A longer length 53 increases a risk of being electrically short-circuited to pad 550, in some instances. A shorter length 53 provides insufficient length for first buffer layer 560 to land, in some instances. Since width 54 is equal to a width 51 of initial portion 544a-1, contact pad 544a has an octagonal shape. In FIG. 5D, when width 54 violates a design rule incapable of being waived in some instances, a width 54' is smaller than width 51. In FIG. 5E, in consideration of a routing of a PPI 570 in some instances, extended portion 544*a*-2 extends toward a direction 52' and forms an angle 55 relative to an edge of initial portion 544*a*-1. In some embodiments, angle 55 ranges from about 0 degree to about 60 degrees. A greater angle 55 increases a risk of being electrically short-circuited to another pad or PPI structure, in some instances.

Figure 6:
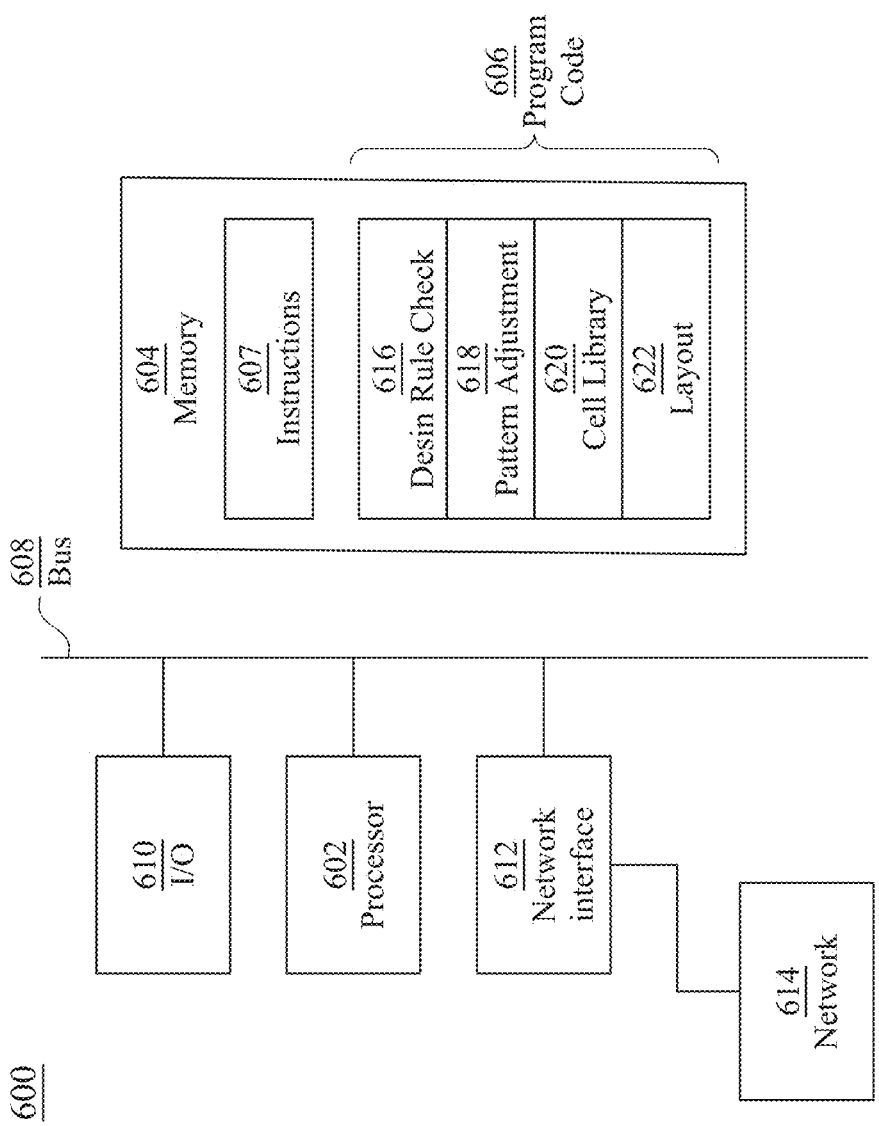
FIG. 6 is a functional block diagram of an integrated circuit designing system in accordance with one or more embodiments.

FIG. 6 is a functional block diagram 600 of an integrated circuit designing system in accordance with one or more embodiments. System 600 includes hardware processing circuitry 602, also referred to as a processor, and a non-transitory, computer readable storage medium 604 encoded with, i.e., storing, the computer program code 607, i.e., a set of executable instructions. Computer readable storage medium 604 is also encoded with instructions 607 for interfacing with manufacturing machines for producing a semiconductor device based on the layout. The processor 602 is electrically coupled to the computer readable storage medium 604 via a bus 608. The processor 602 is also electrically coupled to an I/O interface 610 by bus 608. A network interface 612 is also electrically connected to the processor 602 via bus 608. Network interface 612 is connected to a network 614, so that processor 602 and computer readable storage medium 604 are capable of connecting to external elements via network 614. Processor 602 is configured to execute the computer program code 606 encoded in the computer readable storage medium 604 in order to cause system 600 to be usable for performing a portion or all of the operations as described in method 400.

In some embodiments, the processor 602 is a central processing unit (CPU), a multi-processor, a distributed processing system, an application specific integrated circuit (ASIC), and/or a suitable processing unit.

In some embodiments, the computer readable storage medium 604 is a non-transitory electronic, magnetic, optical, electromagnetic, infrared, and/or a semiconductor system (or apparatus or device). For example, the computer readable storage medium 604 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 504 includes a compact disk-read only memory (CD-ROM), a compact disk-read/write (CD-R/W), and/or a digital video disc (DVD).

In some embodiments, the storage medium 604 stores the computer program code 606 configured to cause system 600 to perform method 400. In some embodiments, the storage medium 604 also stores information needed for performing a method 400 as well as information generated during performing the method 400, such as a design rule check parameter 616, a pattern adjustment parameter 618, a cell library parameter 620, a layout parameter 622, and/or a set of executable instructions to perform the operation of method 400.

In some embodiments, the storage medium 604 stores instructions 607 for interfacing with manufacturing machines. The instructions 607 enable processor 602 to generate manufacturing instructions readable by the manufacturing machines to effectively implement method 400 during a circuit design process of a manufacturing process.

System 600 includes I/O interface 610. I/O interface 610 is coupled to external circuitry. In some embodiments, I/O interface 610 includes a keyboard, keypad, mouse, trackball, trackpad, and/or cursor direction keys for communicating information and commands to processor 602.

System 600 also includes network interface 612 coupled to the processor 602. Network interface 612 allows system 600 to communicate with network 614, to which one or more other computer systems are connected. Network interface 612 includes wireless network interfaces such as BLUETOOTH, WIFI, WIMAX, GPRS, or WCDMA; or wired network interface such as ETHERNET, USB, or IEEE-1394. In some embodiments, method 400 is implemented in two or more systems 600, and information such as physical spacing rules, color spacing rules, cell libraries or a layout are exchanged between different systems 600 via network 614.

System 600 is configured to receive information related to a physical spacing rule through I/O interface 610 or network interface 612. The information is transferred to processor 602 via bus 608 to determine a design rule, e.g., an overlap between two layout patterns. The design rule is then stored in computer readable medium 604 as parameter 616. System 600 is configured to receive information related to pattern adjustment, e.g., extending an edge of a layout pattern, through I/O interface 610 or network interface 612. The information is stored in computer readable medium 604 as pattern adjustment parameter 618. System 600 is configured to receive information related to a cell library through I/O interface 610 or network interface 612. The information is stored in computer readable medium 604 as cell library parameter 620. System 600 is configured to receive information related to a layout through I/O interface 610 or network interface 612. The information is stored in computer readable medium 604 as layout parameter 622.

During operation, processor 602 executes a set of instructions to assign color groups to routing tracks and colors to conductive elements based on the stored parameters 616-622. In some embodiments, system 600 is configured to generate instructions for controlling manufacturing machines for forming masks based on layout parameter 622 as modified during method 400.

Figure 7:
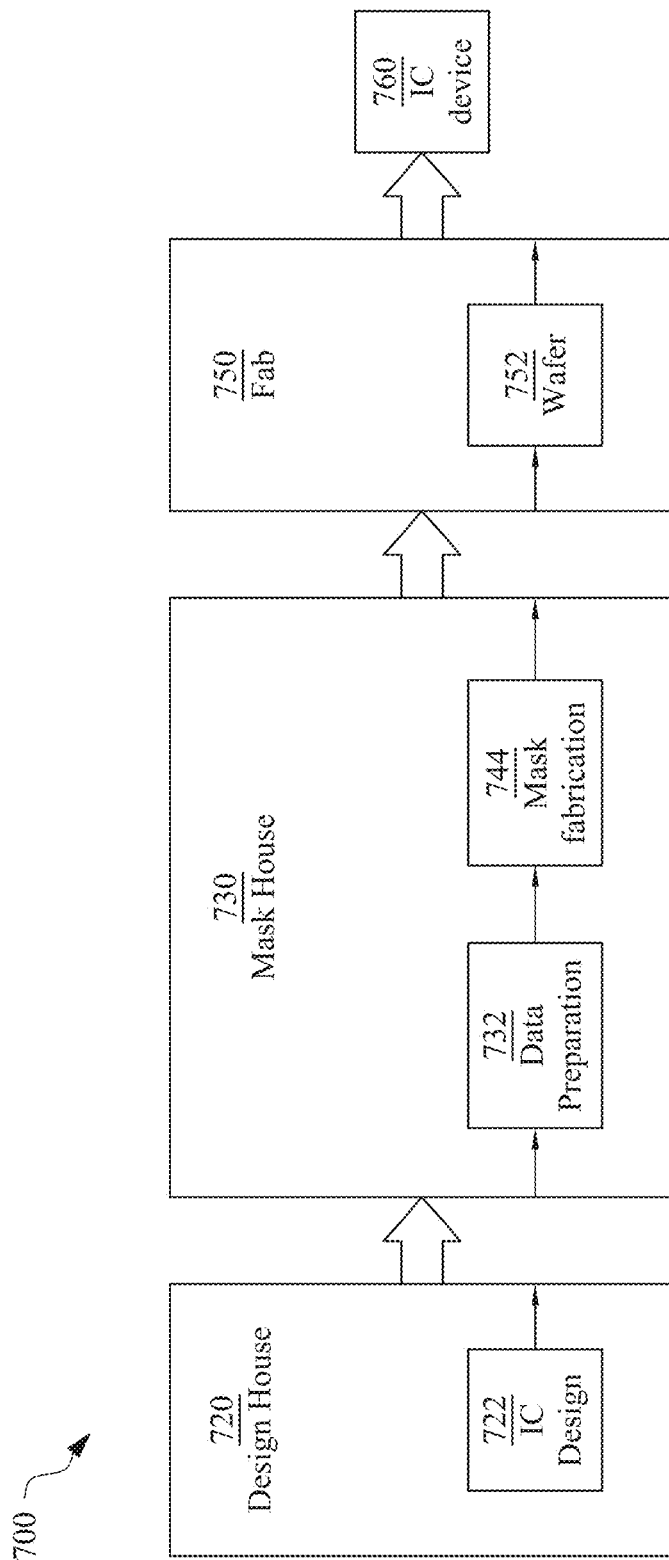
FIG. 7 is a block diagram of an integrated circuit (IC) manufacturing system, and an IC manufacturing flow associated therewith, in accordance with some embodiments.

FIG. 7 is a block diagram of an IC manufacturing system 700, and an IC manufacturing flow associated therewith, in accordance with some embodiments. IC manufacturing system 700 generates a layout (e.g., any one of layouts 500 of corresponding FIG. 5B, or the like). Based on the layout, system 700 fabricates at least one of (a) one or more photomasks or (b) at least one component in a layer of an inchoate semiconductor IC.

IC manufacturing system 700 includes entities, such as a design house 720, a mask house 730, and an IC manufacturer/fabricator ("fab") 750, that interact with one another in the design, development, and manufacturing cycles and/or services related to manufacturing an IC device 760. The entities in system 700 are connected by a communications network. In some embodiments, the communications network is a single network. In some embodiments, the communications network is a variety of different networks, such as an intranet and the internet. The communications network includes wired and/or wireless communication channels. Each entity interacts with one or more of the other entities and provides services to and/or receives services from one or more of the other entities. In some embodiments, two or more of design house 720, mask house 730, and IC fab 750 is owned by a single larger company. In some embodiments, two or more of design house 720, mask house 730, and IC fab 750 coexist in a common facility and use common resources.

Design house (or design team) 720 generates an IC design layout 722. IC design layout 722 includes various geometrical patterns designed for an IC device 760. The geometrical patterns correspond to patterns of conductive, dielectric, or semiconductor layers that make up the various components of IC device 760 to be fabricated. The various layers combine to form various IC features. For example, a portion of IC design layout 722 includes various IC features, such as an active region, gate electrode, source and drain, conductive lines or vias of an interlayer interconnection, and openings for bonding pads, to be formed in a semiconductor substrate (such as a silicon wafer) and various material layers disposed on the semiconductor substrate. Design house 720 implements a proper design procedure to form IC design layout 722. The design procedure includes one or more of logic design, physical design or place and route. IC design layout 722 is presented in one or more data files having information of the geometrical patterns. For example, IC design layout 722 is expressed in a GDSII file format or DFII file format.

Mask house 730 includes data preparation 732 and mask fabrication 744. Mask house 730 uses IC design layout 722 to manufacture one or more masks to be used for fabricating the various layers of IC device 760 according to IC design layout 722. Mask house 730 performs mask data preparation 732, where IC design layout 722 is translated into a representative data file ("RDF"). Mask data preparation 732 provides the RDF to mask fabrication 744. Mask fabrication 744 includes a mask writer. The mask writer converts the RDF to an image on a substrate, such as a photomask (reticle) or a semiconductor wafer. IC design layout 722 is manipulated by mask data preparation 732 to comply with particular characteristics of the mask writer and/or requirements of IC fab 750. In FIG. 7, mask data preparation 732 and mask fabrication 744 are illustrated as separate elements. In some embodiments, mask data preparation 732 and mask fabrication 744 is collectively referred to as mask data preparation.

In some embodiments, mask data preparation 732 includes optical proximity correction (OPC) which uses lithography enhancement techniques to compensate for image errors, such as those that can arise from diffraction, interference, other process effects or the like. OPC adjusts IC design layout 722. In some embodiments, mask data preparation 732 includes further resolution enhancement techniques (RET), such as off-axis illumination, sub-resolution assist features, phase-shifting masks, other suitable techniques, or the like or combinations thereof. In some embodiments, inverse lithography technology (ILT) is also used, which treats OPC as an inverse imaging problem.

In some embodiments, mask data preparation 732 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, or the like. In some embodiments, the MRC modifies the IC design layout to compensate for limitations during mask fabrication 744, which may undo part of the modifications performed by OPC in order to meet mask creation rules.

In some embodiments, mask data preparation 732 includes lithography process checking (LPC) that simulates processing that will be implemented by IC fab 750 to fabricate IC device 760. LPC simulates this processing based on IC design layout 722 to create a simulated manufactured device, such as IC device 760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, or the like or combinations thereof. In some embodiments, after a simulated manufactured device has been created by LPC, if the simulated device is not close enough in shape to satisfy design rules, OPC and/or MRC are be repeated to further refine IC design layout 722.

It should be understood that the above description of mask data preparation 832 has been simplified for the purposes of clarity. In some embodiments, data preparation 732 includes additional features such as a logic operation (LOP) to modify the IC design layout according to manufacturing rules. Additionally, the processes applied to IC design layout 722 during data preparation 732 may be executed in a variety of different orders.

After mask data preparation 732 and during mask fabrication 744, a mask or a group of masks are fabricated based on the modified IC design layout. In some embodiments, an e-beam or a mechanism of multiple e-beams is used to form a pattern on a photomask (reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. The mask(s) generated by mask fabrication 744 is used in a variety of processes. For example, such a mask(s) is used in an ion implantation process to form various doped regions in the semiconductor wafer, in an etching process to form various etching regions in the semiconductor wafer, and/or in other suitable processes.

IC fab 750 is an IC fabrication business that includes one or more manufacturing facilities for the fabrication of a variety of different IC products. In some embodiments, IC Fab 750 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 750 uses the mask (or masks) fabricated by mask house 730 to fabricate IC device 760. Thus, IC fab 750 at least indirectly uses IC design layout 722 to fabricate IC device 760. In some embodiments, a semiconductor wafer 752 is fabricated by IC fab 750 using the mask (or masks) to form IC device 760. Semiconductor wafer 752 includes a silicon substrate or other proper substrate having material layers formed thereon. Semiconductor wafer further includes one or more of various doped regions, dielectric features, multilevel interconnects, or the like (formed at subsequent manufacturing steps).

Details regarding an IC manufacturing system (e.g., system 700 of FIG. 7), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

An aspect of this description relates to a semiconductor structure. The semiconductor structure includes a first contact pad over an interconnect structure. The semiconductor structure further includes a second contact pad over the interconnect structure, wherein the second contact pad is electrically separated from the first contact pad. The semiconductor structure further includes a first buffer layer over the first contact pad, wherein the first buffer layer is partially over the second contact pad, and an edge of the second contact pad farthest from the first contact pad extends beyond the first buffer layer. In some embodiments, the semiconductor structure further includes a post passivation interconnect (PPI) structure extending through the first buffer layer. In some embodiments, the PPI structure electrically connects to the first contact pad. In some embodiments, the semiconductor structure further includes a second buffer layer over the PPI structure. In some embodiments, the first contact pad is electrically isolated from the second contact pad. In some embodiments, the semiconductor structure further includes a third contact pad over the interconnect structure, wherein the second contact pad is between the first contact pad and the third contact pad. In some embodiments, the semiconductor structure further includes a third contact pad over the interconnect structure, wherein the third contact pad is between the first contact pad and the second contact pad. In some embodiments, the first buffer layer is over an entirety of the third contact pad.

An aspect of this description relates to a semiconductor structure. The semiconductor structure includes a first contact pad over an interconnect structure. The semiconductor structure further includes a second contact pad over the interconnect structure. The semiconductor structure further includes a third contact pad, wherein the third contact pad is electrically separated from the first contact pad, and the second contact pad is between the first contact pad and the third contact pad. The semiconductor structure further includes a first buffer layer over the first contact pad, wherein the first buffer layer is partially over the third contact pad, and an edge of the third contact pad extends beyond the first buffer layer. In some embodiments, the semiconductor structure further includes a second buffer layer, wherein the first buffer layer is over the second buffer layer. In some embodiments, an entirety of the third contact pad extends beyond the second buffer layer. In some embodiments, less than an entirety of the third contact pad extends beyond the second buffer layer. In some embodiments, the semiconductor structure further includes a post passivation interconnect (PPI) structure electrically connected to the first contact pad. In some embodiments, the first buffer layer is over the PPI structure. In some embodiments, the first buffer layer includes polyimide (PI), benzocyclobutene (BCB), polybenzoxazole (PBO), epoxy, silicon, acrylate, or nano-filled phenolic resin.

An aspect of this description relates to a semiconductor structure. The semiconductor structure includes a first contact pad over an interconnect structure. The semiconductor structure further includes a second contact pad over the interconnect structure, wherein the second contact pad is electrically separated from the first contact pad. The semiconductor structure further includes a third contact pad, wherein the second contact pad is between the first contact pad and the third contact pad. The semiconductor structure further includes a first buffer layer over the first contact pad, wherein the first buffer layer is partially over the second contact pad, and an edge of the second contact pad extends beyond the first buffer layer. In some embodiments, an entirety of the third contact pad extends beyond the first buffer layer. In some embodiments, the semiconductor structure further includes a fourth contact pad, wherein the fourth contact pad is between the first contact pad and the second contact pad. In some embodiments, the first buffer layer covers an entirety of the fourth contact pad. In some embodiments, the semiconductor structure further includes a post passivation interconnect (PPI) structure electrically connected to the first contact pad, wherein the first buffer layer is over the PPI structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a first contact pad over an interconnect structure;
   a second contact pad over the interconnect structure, wherein the second contact pad is electrically separated from the first contact pad; and
   a first buffer layer over the first contact pad, wherein the first buffer layer is partially over the second contact pad, and an edge of the second contact pad farthest from the first contact pad extends beyond the first buffer layer.

2. The semiconductor structure of claim 1, further comprising a post passivation interconnect (PPI) structure extending through the first buffer layer.

3. The semiconductor structure of claim 2, wherein the PPI structure electrically connects to the first contact pad.

4. The semiconductor structure of claim 2, further comprising a second buffer layer over the PPI structure.

5. The semiconductor structure of claim 1, wherein the first contact pad is electrically isolated from the second contact pad.

6. The semiconductor structure of claim 1, further comprising a third contact pad over the interconnect structure, wherein the second contact pad is between the first contact pad and the third contact pad.

7. The semiconductor structure of claim 1, further comprising a third contact pad over the interconnect structure, wherein the third contact pad is between the first contact pad and the second contact pad.

8. The semiconductor structure of claim 7, wherein the first buffer layer is over an entirety of the third contact pad.

9. A semiconductor structure comprising:
   a first contact pad over an interconnect structure;
   a second contact pad over the interconnect structure;
   a third contact pad, wherein the third contact pad is electrically separated from the first contact pad, and the second contact pad is between the first contact pad and the third contact pad; and a first buffer layer over the first contact pad, wherein the first buffer layer is partially over the third contact pad, and an edge of the third contact pad extends beyond the first buffer layer.

10. The semiconductor structure of claim 9, further comprising a second buffer layer, wherein the first buffer layer is over the second buffer layer.

11. The semiconductor structure of claim 10, wherein an entirety of the third contact pad extends beyond the second buffer layer.

12. The semiconductor structure of claim 10, wherein less than an entirety of the third contact pad extends beyond the second buffer layer.

13. The semiconductor structure of claim 9, further comprising a post passivation interconnect (PPI) structure electrically connected to the first contact pad.

14. The semiconductor structure of claim 13, wherein the first buffer layer is over the PPI structure.

15. The semiconductor structure of claim 9, wherein the first buffer layer comprises polyimide (PI), benzocyclobutene (BCB), polybenzoxazole (PBO), epoxy, silicon, acrylate, or nano-filled phenolic resin.

16. A semiconductor structure comprising:
a first contact pad over an interconnect structure;
a second contact pad over the interconnect structure, wherein the second contact pad is electrically separated from the first contact pad;
a third contact pad, wherein the second contact pad is between the first contact pad and the third contact pad; and
a first buffer layer over the first contact pad, wherein the first buffer layer is partially over the second contact pad, and an edge of the second contact pad extends beyond the first buffer layer.

17. The semiconductor structure of claim 16, wherein an entirety of the third contact pad extends beyond the first buffer layer.

18. The semiconductor structure of claim 16, further comprising a fourth contact pad, wherein the fourth contact pad is between the first contact pad and the second contact pad.

19. The semiconductor structure of claim 18, wherein the first buffer layer covers an entirety of the fourth contact pad.

20. The semiconductor structure of claim 16, further comprising a post passivation interconnect (PPI) structure electrically connected to the first contact pad, wherein the first buffer layer is over the PPI structure.

* * * * *